(12) United States Patent
Chiang et al.

(10) Patent No.: US 8,975,641 B1
(45) Date of Patent: Mar. 10, 2015

(54) TRANSISTOR HAVING AN OHMIC CONTACT BY GRADIENT LAYER AND METHOD OF MAKING THE SAME

(71) Applicant: Taiwan Semiconductor Manufacturing Company Ltd., Hsinchu (TW)

(72) Inventors: Chen-Hao Chiang, Jhongli (TW); Po-Chun Liu, Hsinchu (TW); Chi-Ming Chen, Zhubei (TW); Chung-Yi Yu, Hsinchu (TW); Chia-Shiung Tsai, Hsinchu (TW); Xiaomeng Chen, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 14/010,268

(22) Filed: Aug. 26, 2013

(51) Int. Cl.
 *H01L 31/0256* (2006.01)
 *H01L 29/778* (2006.01)
 *H01L 29/205* (2006.01)
 *H01L 29/20* (2006.01)
 *H01L 29/66* (2006.01)

(52) U.S. Cl.
 CPC .......... *H01L 29/7786* (2013.01); *H01L 29/205* (2013.01); *H01L 29/2003* (2013.01); *H01L 29/66431* (2013.01)
 USPC .............................. 257/76; 257/192; 438/172

(58) Field of Classification Search
 USPC ...................... 257/76, 192, E29.246; 438/172
 See application file for complete search history.

(56) References Cited

U.S. PATENT DOCUMENTS

| | | | |
|---|---|---|---|
| 7,112,830 B2 | 9/2006 | Munns | |
| 7,547,925 B2 | 6/2009 | Wong et al. | |
| 7,557,411 B2* | 7/2009 | Noguchi et al. | 257/347 |
| 2004/0217375 A1* | 11/2004 | Yokogawa et al. | 257/192 |
| 2007/0108456 A1 | 5/2007 | Wong et al. | |
| 2013/0161638 A1* | 6/2013 | Yao et al. | 257/76 |
| 2013/0200495 A1* | 8/2013 | Keller et al. | 257/615 |

OTHER PUBLICATIONS

Srivastava, P., et al., "Si Trench Around Drain (STAD) Technology of GaN-DHFETs on Si Substrate for Boosting Power Performance", IEEE, 2001, pp. IEDM11-473-IEDM11-476.

* cited by examiner

*Primary Examiner* — Phuc Dang
(74) *Attorney, Agent, or Firm* — Lowe Hauptman & Ham, LLP

(57) ABSTRACT

A transistor includes a substrate, a channel layer over the substrate and an active layer over the channel layer. The active layer includes a gradient having a first concentration of a first material at an interface with the channel layer and a second concentration of the first material at a surface opposite the channel layer, and the first concentration is higher than the second concentration.

20 Claims, 4 Drawing Sheets

TRANSISTOR HAVING AN OHMIC CONTACT BY GRADIENT LAYER AND METHOD OF MAKING THE SAME

RELATED APPLICATIONS

The instant application is related to the following U.S. Patent Applications:

U.S. Patent Application titled "TRANSISTOR HAVING PARTIALLY OR WHOLLY REPLACED SUBSTRATE AND METHOD OF MAKING THE SAME," U.S. application Ser. No. 13,944,779;

U.S. Patent Application titled "TRANSISTOR HAVING HIGH BREAKDOWN VOLTAGE AND METHOD OF MAKING THE SAME," U.S. application Ser. No. 13/944,713;

U.S. Patent Application titled "SEMICONDUCTOR DEVICE, HIGH ELECTRON MOBILITY TRANSISTOR (HEMT) AND METHOD OF MANUFACTURING," U.S. application Ser. No. 13,944/625;

U.S. Patent Application titled "TRANSISTOR HAVING BACK-BARRIER LAYER AND METHOD OF MAKING THE SAME," U.S. application Ser. No. 13/944,584;

U.S. Patent Application titled "TRANSISTOR HAVING DOPED SUBSTRATE AND METHOD OF MAKING THE SAME," U.S. application Ser. No. 13/944,494;

U.S. Patent Application titled "TRANSISTOR HAVING A BACK-BARRIER LAYER AND METHOD OF MAKING THE SAME," U.S. application Ser. No. 13/944/672; and U.S. Patent Application titled "TRANSISTOR HAVING OHMIC CONTACT BY SCREEN LAYER AND METHOD OF MAKING THE SAME," U.S. application Ser. No. 14/010,220.

The entire contents of the above-referenced applications are incorporated by reference herein.

BACKGROUND

In semiconductor technology, Group III-Group V (or III-V) semiconductor compounds are used to form various integrated circuit devices, such as high power field-effect transistors, high frequency transistors, high electron mobility transistors (HEMTs), or metal-insulator-semiconductor field-effect transistors (MISFETs). A HEMT is a field effect transistor incorporating a junction between two materials with different band gaps (i.e., a heterojunction) as the channel instead of a doped region, as is generally the case for metal oxide semiconductor field effect transistors (MOSFETs). In contrast with MOSFETs, HEMTs have a number of attractive properties including high electron mobility and the ability to transmit signals at high frequencies, etc. However, consistently forming low resistance, ohmic contacts with HEMTs is often difficult.

BRIEF DESCRIPTION OF THE DRAWINGS

One or more embodiments are illustrated by way of example, and not by limitation, in the figures of the accompanying drawings, wherein elements having the same reference numeral designations represent like elements throughout. It is emphasized that, in accordance with standard practice in the industry various features may not be drawn to scale and are used for illustration purposes only. In fact, the dimensions of the various features in the drawings may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are examples and are not intended to be limiting.

Figure 1:
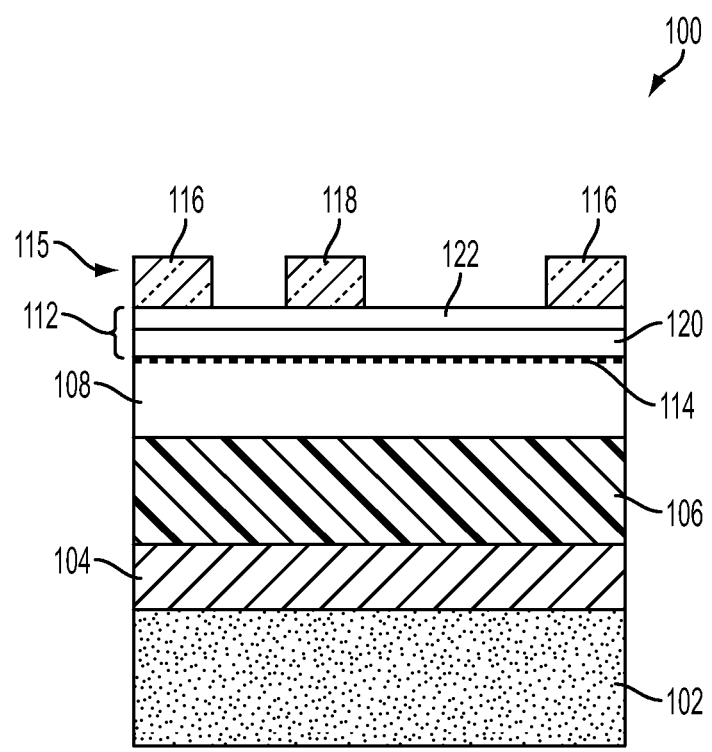
FIG. 1 is a cross-sectional view of a high electron mobility transistor (HEMT) having an active layer including a gradient layer in accordance with one or more embodiments.

FIG. 1 is a cross-sectional view of a high electron mobility transistor (HEMT) 100 having an active layer 112 including a gradient layer 120 in accordance with one or more embodiments. HEMT 100 includes a substrate 102. A nucleation layer 104 is over substrate 102. In some embodiments, nucleation layer 104 includes multiple layers, such as one or more seed layers. A buffer layer 106 is over nucleation layer 104. A channel layer 108 is over buffer layer 106. An active layer 112 is over the channel layer 108. The active layer 112 includes a gradient layer 120 over channel layer 108 and, in some embodiments, an interface layer 122, such as an n-type GaN (n-GaN) layer, over the gradient layer 120. Due to a band gap discontinuity between the channel layer 108 and the active layer 112, a two dimension electron gas (2-DEG) 114 is formed in the channel layer 108 near an interface with the active layer 112. A metal layer 115 includes electrodes 116 over the channel layer 108 and a gate 118 over active layer 112 between the electrodes 116.

Substrate 102 acts as a support for HEMT 100. In some embodiments, substrate 102 is a silicon substrate. In some embodiments, substrate 102 includes silicon carbide (SiC), sapphire, or another suitable substrate material. In some embodiments, substrate 102 is a silicon substrate having a (111) lattice structure.

Nucleation layer 104 helps to compensate for a mismatch in lattice structures between substrate 102 and buffer layer 106. In some embodiments, nucleation layer 104 includes multiple layers. In some embodiments, nucleation layer 104 includes a same material or different materials formed at different temperatures. In some embodiments, nucleation layer 104 includes a step-wise change in lattice structure. In some embodiments, nucleation layer 104 includes a continuous change in lattice structure. In some embodiments, nucleation layer 104 is formed by epitaxially growing the nucleation layer on substrate 102.

In at least one example, nucleation layer 104 comprises a first layer of aluminum nitride (AlN), a second layer of AlN over the first layer of AlN. The first layer of AlN, e.g., is formed at a low temperature, ranging from about 900° C. to about 1000° C., and has a thickness ranging from about 10 nanometers (nm) to about 50 nm. If the thickness of the first layer of AlN is too small, subsequent layers formed on the first layer of AlN will experience a high stress at the interface with the first AlN layer due to lattice mismatch increasing a risk of layer separation. If the thickness of the first layer of AlN is too great, the material is wasted and production costs increase. The second layer of AlN is formed, e.g., at a high temperature, ranging from about 1000° C. to about 1300° C., and has a thickness ranging from about 50 nm to about 200 nm. The higher temperature provides a different lattice structure in the second AlN layer in comparison with the first AlN layer. The lattice structure in the second AlN layer is more different from a lattice structure of substrate 102 than the first AlN layer. If the thickness of the second layer of AlN is too small, subsequent layers formed on the second layer of AlN will experience a high stress at the interface with the second layer of AlN due to lattice mismatch increasing the risk of layer separation. If the thickness of the second layer of AlN is too great, the material is wasted and production costs increase.

In some embodiments, nucleation layer 104 is omitted, and thus buffer layer 106 is directly on substrate 102.

In at least one example, buffer layer 106 includes three graded layers. A first graded layer adjoins nucleation layer 104. The first graded layer includes $Al_xGa_{1-x}N$, where x ranges from about 0.7 to about 0.9. A thickness of the first graded layer ranges from about 50 nm to about 200 nm. A second graded layer is on the first graded layer. The second graded layer includes $Al_xGa_{1-x}N$, where x ranges from about 0.4 to about 0.6. A thickness of the second graded layer ranges from about 150 nm to about 300 nm. A third graded layer is on the second graded layer. The third graded layer includes $Al_xGa_{1-x}N$, where x ranges from about 0.15 to about 0.3. A thickness of the third graded layer ranges from about 350 nm to about 600 nm.

If the buffer layer 106 is too thin, channel layer 108 will have a high stress at an interface with buffer layer 106 and increase the risk of separation between the buffer layer and the channel layer. If the buffer layer 106 is too thick, material is wasted and production costs increase. In some embodiments, the buffer layer 106 is formed at a temperature ranging from about 1000° C. to about 1200° C.

In some embodiments, buffer layer 106 provides a p-type doped layer to reduce electron injection from substrate 102. Electron injection occurs when electrons from substrate 102 diffuse into the channel layer 108. By including p-type dopants in buffer layer 106, the electrons are trapped by the buffer layer and do not negatively impact performance of 2-DEG 114 in the channel layer. In some embodiments, the p-type dopants include carbon, iron, magnesium, zinc or other suitable p-type dopants. In some embodiments, a concentration of the p-type dopant is greater than or equal to about $1\times10^{19}$ ions/cm$^3$. If the p-type dopant concentration is too low, buffer layer 106 will not be able to effectively prevent electron injection from substrate 102. If the p-type dopant concentration is too high, p-type dopants will diffuse into the channel layer and negatively impact 2-DEG 114. In some embodiments, buffer layer 106 is formed using an epitaxial process. In some embodiments, buffer layer 106 is formed at a temperature ranging from about 1000° C. to about 1200° C.

Channel layer 108 is used to help form a conductive path for selectively connecting electrodes 116. In some embodiments, the channel layer 108 includes GaN. In some embodiments, the channel layer 108 has a p-type dopant concentration of equal to or less than $1\times10^{17}$ ions/cm$^3$. In some embodiments, the channel layer 108 is an undoped layer or an unintentionally doped layer. In some embodiments, the channel layer 108 has a thickness ranging from about 0.5 μm to about 2.0 μm. In at least one example, the channel layer 108 has a thickness greater than 1.25 μm. If a thickness of the channel layer 108 is too thin, the channel layer will not provide sufficient charge carriers to allow HEMT 100 to function properly. If the thickness of the channel layer 108 is too great, material is wasted and production costs increase. In some embodiments, the channel layer 108 is formed by an epitaxial process. In some embodiments, the channel layer 108 is formed at a temperature ranging from about 1000° C. to about 1200° C.

Active layer 112 is used to provide the band gap discontinuity with the channel layer 108 to form 2-DEG 114. In some embodiments, active layer 112 includes the gradient layer 120 over the channel layer 108 and, in some embodiments, an interface layer 122 is over the gradient layer 120.

In some embodiments, the gradient layer 120 includes aluminum gallium nitride ($Al_yGa_{(1-y)}N$), where y is a decimal ranging from 0 to 1 and represents an aluminum content ratio. The gradient layer 120 is over and in contact with the channel layer 108. Gradient layer 120 has a maximum aluminum content at a portion of the gradient layer 120 closest (proximal) to the channel layer, i.e., near the bottom of the gradient layer 120 as illustrated in FIG. 1, and has a minimum aluminum content at a portion furthest (distal) from channel layer, i.e., near the top of the gradient layer 120 as illustrated in FIG. 1. More specifically, y is between about 0.15 and about 0.50, at a proximal portion closest to the channel layer 108 and gradually approaches zero at a distal portion of the gradient layer 120 furthest above the channel layer. In some embodiments y ranges from about 0.25 to about 0. Thus, the aluminum in the $Al_yGa_{(1-y)}N$ forms a decreasing gradient in concentration between the proximal portion and distal portion of the gradient layer 120. Having a higher aluminum concentration at the bottom of the gradient layer 120 in contact with the channel layer 108 enables an improved 2-DEG layer 114. Having a lower aluminum concentration at the top of the gradient layer 120 in contact with the interface layer 122 (when present) or metal layer 115 enables an improved ohmic contact. The steadily decreasing aluminum concentration between the proximal and distal portions of the gradient layer 120 enables a reduce the Schottky barrier at the interface between the channel layer 108 and the active layer 112. In some embodiments, the gradient layer 120 is between 20 nm and 30 nm thick.

In some embodiments, gradient layer 120 includes one or more ternary compound semiconductors other than $Al_yGa_{(1-y)}N$, such as indium aluminum nitride ($In_zAl_{(1-z)}N$). In some embodiments, z ranges from about 0.1 to about 0.9. In some embodiments, gradient layer 120 includes a complex structure including multiple layers some having one continuous aluminum concentration or a gradient aluminum concentration.

The interface layer 122 is used to form a conductive path for selectively electrically coupling electrodes 116 and gate 118. The interface layer 122, in some embodiments, is an n-GaN layer. In some embodiments, the n-type dopants include silicon, oxygen or other suitable n-type dopants. In some embodiments, the interface layer 122 is about 2 nm to about 5 nm thick. In some embodiments, the interface layer 122 is formed by performing an epitaxial process. In some embodiments, the epitaxial process includes a MOCVD process, a MBE process, an HVPE process or another suitable epitaxial process.

2-DEG 114 acts as the channel for providing conductivity between electrodes 116. Electrons from a piezoelectric effect in active layer 112 drop into the channel layer, and thus create a thin layer of highly mobile conducting electrons in the channel layer.

Electrodes 116 act as a source and a drain for HEMT 100 for transferring a signal into or out of the HEMT. Gate 118 helps to modulate conductivity of 2-DEG 114 for transferring the signal between electrodes 116.

HEMT 100 is normally conductive meaning that a positive voltage applied to gate 118 will reduce the conductivity between electrodes 116 along 2-DEG 114.

Figure 2:
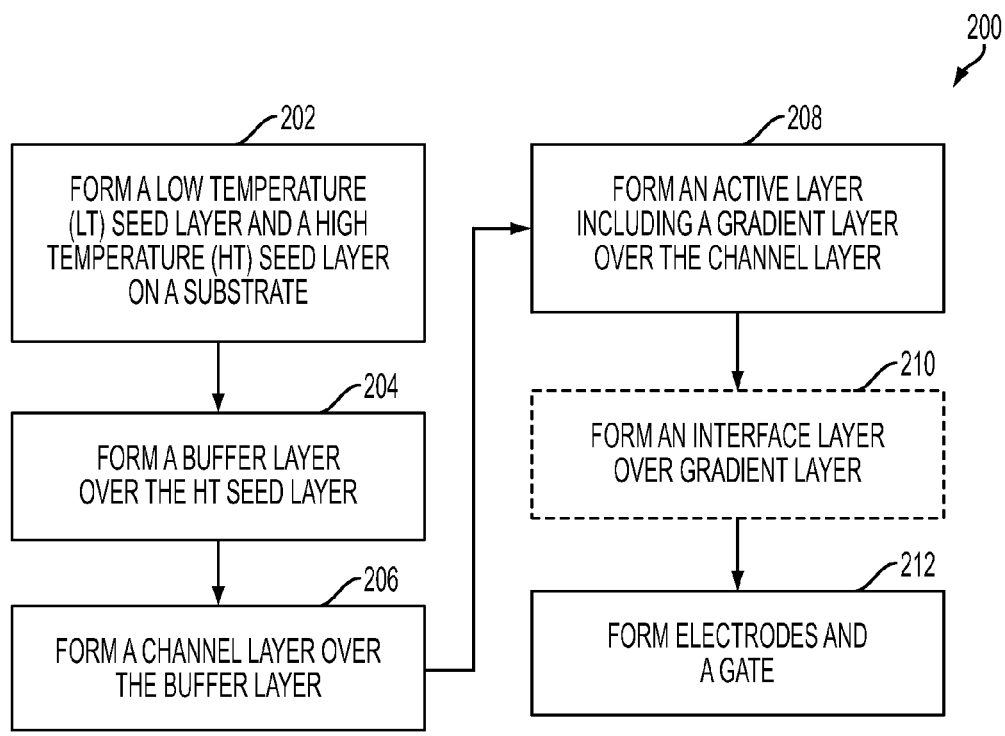
FIG. 2 is a flow chart of a method of making an HEMT having a an active layer including a gradient layer in accordance with one or more embodiments.

FIG. 2 is a flow chart of a method 200 of making an HEMT having an active layer including a gradient layer 120 in accordance with one or more embodiments. Method 200 begins with operation 202 in which a low temperature (LT) seed layer and a high temperature (HT) seed layer are formed on a substrate, e.g., substrate 102. The LT seed layer is formed on the substrate and the HT seed layer is formed on the LT seed layer.

In some embodiments, LT seed layer and HT seed layer include AlN. In some embodiments, the formation of LT seed layer and HT seed layer are performed by an epitaxial growth process. In some embodiments, the epitaxial growth process includes a metal-organic chemical vapor deposition (MOCVD) process, a molecular beam epitaxy (MBE) process, a hydride vapor phase epitaxy (HVPE) process or another suitable epitaxial process. In some embodiments, the MOCVD process is performed using aluminum-containing precursor and nitrogen-containing precursor. In some embodiments, the aluminum-containing precursor includes trimethylaluminium (TMA), triethylaluminium (TEA), or other suitable chemical. In some embodiments, the nitrogen-containing precursor includes ammonia, tertiarybutylamine (TBAm), phenyl hydrazine, or other suitable chemical. In some embodiments, the LT seed layer and/or the HT seed layer includes a material other than AlN. In some embodiments, the HT seed layer has a thickness ranging from about 50 nm to about 200 nm. In some embodiments, the HT seed layer is formed at a temperature ranging from about 1000° C. to about 1300° C. In some embodiments, the LT seed layer had a thickness ranging from about 10 nm to about 50 nm. In some embodiments, the LT seed layer is formed at a temperature ranging from about 900° C. to about 1000° C.

Method 200 continues with operation 204 in which a buffer layer is formed on the HT seed layer. In some embodiments, the buffer layer includes an aluminum-gallium nitride ($Al_xGa_{(1-x)}N$) layer. In some embodiments, the aluminum gallium nitride layer has two or more aluminum-gallium nitride layers each having a different ratio x decreased from the bottom to the top. In some embodiments, each of the two or more aluminum-gallium nitride layers is formed by performing an epitaxial process. In some embodiments, the epitaxial process includes a MOCVD process, a MBE process, an HVPE process or another suitable epitaxial process. In some embodiments, the MOCVD process uses an aluminum-containing precursor, a gallium-containing precursor, and a nitrogen-containing precursor. In some embodiments, the aluminum-containing precursor includes TMA, TEA, or other suitable chemical. In some embodiments, the gallium-containing precursor includes trimethylgallium (TMG), triethylgallium (TEG), or other suitable chemical. In some embodiments, the nitrogen-containing precursor includes ammonia, TBAm, phenyl hydrazine, or other suitable chemical. In some embodiments, the graded layer is formed at a temperature ranging from about 1000° C. to about 1200° C.

In at least one example, the buffer layer includes a first layer including $Al_xGa_{1-x}N$, where x ranges from about 0.7 to about 0.9. A thickness of the first layer ranges from about 50 nm to about 200 nm. A second layer is on the first layer. The second layer includes $Al_xGa_{1-x}N$, where x ranges from about 0.4 to about 0.6. A thickness of the second layer ranges from about 150 nm to about 300 nm. A third layer is on the second layer. The third layer includes $Al_xGa_{1-x}N$, where x ranges from about 0.15 to about 0.3. A thickness of the third layer ranges from about 350 nm to about 600 nm.

Figure 3A:
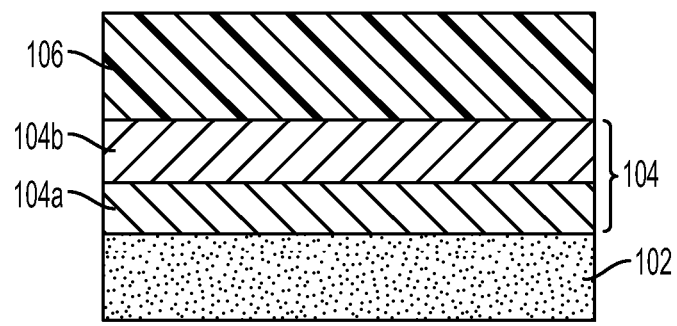
FIGS. 3A-3C are cross-sectional view of a HEMT having a an active layer including a gradient layer at various stages of production in accordance with one or more embodiments.

FIG. 3A is a cross-sectional view of a HEMT following operation 204 in accordance with one or more embodiments. The HEMT includes substrate 102 and nucleation layer 104 on the substrate. Nucleation layer 104 includes an LT seed layer 104a on substrate 102, a HT seed layer 104b on the LT seed layer. Buffer layer 106 is on HT seed layer 104b. For the sake of simplicity, nucleation layer 104 is depicted as a single layer in the following cross-sectional views.

Returning to FIG. 2, in operation 206 a channel layer is formed on the buffer layer. In some embodiments, the channel layer is formed by performing an epitaxial process. In some embodiments, the epitaxial process includes a MOCVD process, a MBE process, an HVPE process or another suitable epitaxial process. In some embodiments, the first portion of the channel layer has a thickness ranging from about 0.5 μm to about 2.0 μm. In some embodiments, the dopant concentration in the first portion of the channel layer is equal to or less than about $1 \times 10^{17}$ ions/cm$^3$. In some embodiments, the first portion of the channel layer is formed at a temperature ranging from about 1000° C. to about 1200° C.

Figure 3B:
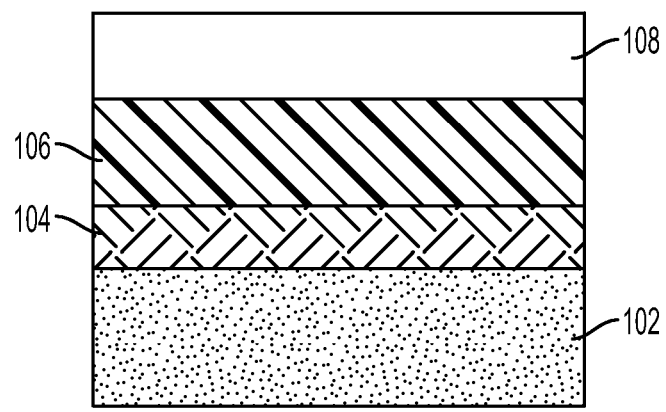

FIG. 3B is a cross-sectional view of a HEMT following operation 206 in accordance with one or more embodiments. The HEMT includes channel layer 108 over buffer layer 106.

Returning to FIG. 2, in operation 208 an active layer is formed on the channel layer. In some embodiments, the active layer includes a gradient layer. The gradient layer includes $Al_yGa_{(1-y)}N$, where y is a decimal representing an aluminum content ratio. In some embodiments, y is between about 0.15 and about 0.50, at a proximal portion closest to the channel layer and gradually approaches zero corresponding to no aluminum at a distal portion of the gradient layer furthest above the channel layer. In some embodiments, y ranges from about 0.25 to about 0. The gradient layer is formable by performing an epitaxial process. In some embodiments, the epitaxial process includes a MOCVD process, a MBE process, HVPE process or another suitable epitaxial process. In some embodiments, the gradient layer has a thickness ranging from about 20 nm to about 30 nm. In some embodiments, the gradient layer is formed at a temperature ranging from about 1000° C. to about 1200° C.

Figure 3C:
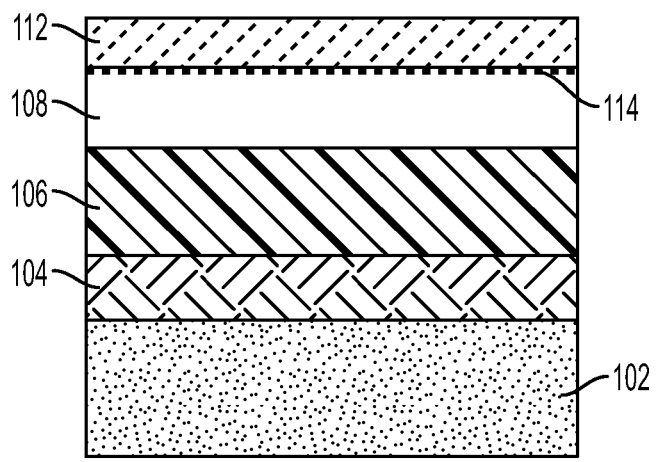

FIG. 3C is a cross-sectional view of a HEMT following operation 208 in accordance with one or more embodiments. The HEMT includes active layer 112 on the channel layer 108. The active layer 112 includes the gradient layer 120 and the n-GaN layer 122. 2-DEG 114 is formed in of the channel layer 108 due to the band gap discontinuity between the gradient layer 120 in the active layer 112 and the channel layer 108.

Returning to FIG. 2, in operation 210 an interface layer is formed on the channel layer. In some embodiments, the interface layer includes an n-type GaN layer. The interface layer, in some embodiments, is an n-GaN layer. In some embodiments, the n-type dopants include silicon, oxygen or other suitable n-type dopants. In some embodiments, the interface layer is about 2 nm to about 5 nm thick. In some embodiments, the interface layer is formed by performing an epitaxial process. In some embodiments, the epitaxial process includes a MOCVD process, a MBE process, an HVPE process or another suitable epitaxial process. In some embodiments, operation 210 is omitted.

In operation 212, electrodes and a gate are formed on the gradient layer. In some embodiments which include operation 210, the electrodes and the gate are formed on the interface layer. In some embodiments, the electrodes and the gate include copper, aluminum, titanium or another suitable conductive material. The electrodes are formed over the gradient layer, and the gate is formed over the active layer. A metal layer is deposited over the gradient layer. A patterned photoresist layer is formed over the metal layer, and the metal layer is etched to form the electrodes over the openings and the gate over the upper surface of the active layer. In some embodiments, the metal layer for forming the electrodes or the gate includes one or more conductive materials. In some embodiments, the electrodes or the gate include one or more layers of conductive materials. In at least one embodiment, the electrodes or the gate include at least one barrier layer contacting the other portion of the channel layer and/or the active layer.

Following operation 212 the HEMT has a similar structure to HEMT 100.

One aspect of this description relates to a transistor. The transistor includes a substrate, a channel layer over the substrate and an active layer over the channel layer. The active layer includes a gradient having a first concentration of a first material at an interface with the channel layer and a second concentration of the first material at a surface opposite the channel layer, and the first concentration is higher than the second concentration.

Another aspect of this description relates to a transistor. The transistor includes a substrate, an aluminum nitride (AlN) nucleation layer over the substrate, and an aluminum gallium nitride ($Al_yGa_{(1-y)}N$) buffer layer over the AlN nucleation layer. The transistor further includes a GaN channel layer over the $Al_yGa_{(1-y)}N$ buffer layer and an active layer over the GaN channel layer. The active layer includes a gradient layer including aluminum gallium nitride ($Al_xGa_{(1-x)}N$) and an n-type gallium nitride (n-GaN) layer on the gradient layer. The transistor further includes a metal layer over the n-GaN buffer layer and a two dimensional electron gas (2-DEG) in the channel layer adjacent an interface between the channel layer and the gradient layer.

Still another aspect of this description relates to a method of making a transistor. The method of includes forming a channel layer over a substrate and forming an active layer over the channel layer. Forming the active layer comprises forming a gradient having a first concentration of a first material at an interface with the channel layer and a second concentration of the first material at a surface opposite the channel layer, and the first concentration is higher than the second concentration.

It will be readily seen by one of ordinary skill in the art that the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A transistor comprising:
   a substrate;
   a channel layer over the substrate;
   an active layer over the channel layer, wherein the active layer comprises a gradient layer having a first concentration of a first material at an interface with the channel layer and a second concentration of the first material at a surface opposite the channel layer, and the first concentration is higher than the second concentration, wherein the first concentration steadily decreases from the first value at the interface to the second value at the surface opposite the channel layer.

2. The transistor of claim 1, wherein the gradient layer comprises aluminum gallium nitride ($Al_yGa_{(1-y)}N$), and the first material comprises aluminum.

3. The transistor of claim 2, wherein the first concentration y ranges from about 0.2 to about 0.3, and the second concentration y ranges from about 0.1 to about 0.

4. The transistor of claim 2, wherein y gradually decreases from a maximum value at the interface with the channel layer to a minimum value at the surface opposite the channel layer.

5. The transistor of claim 1, further comprising:
   a buffer layer between the substrate and the channel layer.

6. The transistor of claim 5, wherein the buffer layer comprises:
   a first aluminum gallium nitride layer having a first aluminum concentration;
   a second aluminum gallium nitride layer having a second aluminum concentration less than the first aluminum concentration; and
   a third aluminum gallium nitride layer having a third aluminum concentration less than the second aluminum concentration.

7. The transistor of claim 1, further comprising a nucleation layer between the substrate and the channel layer, wherein the nucleation layer comprises:
   a first seed layer having a first lattice structure;
   a second seed layer on the first seed layer, the second seed layer having a second lattice structure different from the first lattice structure.

8. The transistor of claim 1, wherein the active layer further comprises an interface layer over the gradient layer, wherein the interface layer comprises n-doped gallium nitride (n-GaN).

9. The transistor of claim 1, further comprising:
   a first electrode on the active layer, wherein the first electrode forms an ohmic contact with the active layer;
   a second electrode on the active layer, wherein the second electrode forms an ohmic contact with the active layer; and
   a gate between the first electrode and the second electrode, wherein the gate is configured to control a conductivity of a 2-DEG formed between the first electrode and the second electrode.

10. The transistor of claim 9, wherein the gate is on the active layer, and the transistor is configured to be normally conductive.

11. A transistor comprising:
    a substrate;
    an aluminum nitride (AlN) nucleation layer over the substrate
    an aluminum gallium nitride ($Al_yGa_{(1-y)}N$) buffer layer over the AlN nucleation layer;
    a GaN channel layer over the $Al_yGa_{(1-y)}N$ buffer layer;
    an active layer over the GaN channel layer, the active layer comprising:
      a gradient layer including aluminum gallium nitride ($Al_xGa_{(1-x)}N$); and
      an n-type gallium nitride (n-GaN) layer on the gradient layer;
    a metal layer over the n-GaN buffer layer; and
    a two dimensional electron gas (2-DEG) in the channel layer adjacent an interface between the channel layer and the gradient layer.

12. The transistor of claim 11, wherein the x ranges from about 0.2 to about 0.3 at an interface with the GaN channel layer, and x ranges from about 0.1 to about 0 at a surface of the gradient layer opposite the GaN channel layer.

13. The transistor of claim 11, wherein x gradually decreases from a maximum value at the interface with the GaN channel layer to a minimum value at the surface opposite the GaN channel layer.

14. The transistor of claim 11, wherein the aluminum gallium nitride buffer layer comprises:
- a first aluminum gallium nitride layer having a first aluminum concentration;
- a second aluminum gallium nitride layer having a second aluminum concentration less than the first aluminum concentration; and
- a third aluminum gallium nitride layer having a third aluminum concentration less than the second aluminum concentration.

15. The transistor of claim 11, wherein the aluminum nitride nucleation comprises:
- a first aluminum nitride seed layer having a first lattice structure;
- a second aluminum nitride seed layer on the first seed layer, the second seed layer having a second lattice structure different from the first lattice structure.

16. The transistor of claim 11, wherein the metal layer comprises:
- a first electrode on the active layer, wherein the first electrode forms an ohmic contact with the active layer;
- a second electrode on the active layer, wherein the second electrode forms an ohmic contact with the active layer; and
- a gate between the first electrode and the second electrode, wherein the gate is configured to control a conductivity of the 2-DEG.

17. The transistor of claim 16, wherein the gate is on the active layer, and the transistor is configured to be normally conductive.

18. A method of making a transistor, the method comprising:
- forming a channel layer over a substrate;
- forming an active layer over the channel layer, wherein forming the active layer comprises forming a gradient layer having a first concentration of a first material at an interface with the channel layer and a second concentration of the first material at a surface opposite the channel layer, and the first concentration is higher than the second concentration, wherein the first concentration steadily decreases from the first value at the interface to the second value at the surface opposite the channel layer.

19. The method of claim 18, wherein forming the gradient layer comprises forming an aluminum gallium nitride ($Al_y Ga_{(1-y)}N$), and the first material comprises aluminum, wherein the first concentration y ranges from about 0.2 to about 0.3, and the second concentration y ranges from about 0.1 to about 0.

20. The method of claim 18, further comprising:
- forming a first electrode on the active layer, wherein the first electrode forms an ohmic contact with the active layer;
- forming a second electrode on the active layer, wherein the second electrode forms an ohmic contact with the active layer; and
- forming a gate between the first electrode and the second electrode, wherein the gate is configured to control a conductivity of a 2-DEG formed between the first electrode and the second electrode.

* * * * *